United States Patent
Ema et al.

(10) Patent No.: US 6,372,413 B2
(45) Date of Patent: Apr. 16, 2002

(54) METHOD FOR CLEANING THE SURFACE OF SUBSTRATE TO WHICH RESIDUES OF RESIST STICK

(75) Inventors: Tatsuhiko Ema, Kawasaki; Shinichi Ito, Yokohama, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/893,464

(22) Filed: Jun. 29, 2001

(30) Foreign Application Priority Data

Jun. 30, 2000 (JP) ............................................ 12-200252

(51) Int. Cl.[7] .............................. G03F 7/30; G03F 7/32; G03F 7/40
(52) U.S. Cl. ...................... 430/326; 430/325; 430/331; 134/2; 134/30
(58) Field of Search ................................ 430/325, 326, 430/331; 134/2, 30

(56) References Cited

U.S. PATENT DOCUMENTS 6,007,970 A * 12/1999 Ohmi et al. ................ 430/331

FOREIGN PATENT DOCUMENTS

| JP | 9-255998 | 9/1997 |
| JP | 11-307497 | 11/1999 |
| JP | 2000-228380 | 8/2000 |

* cited by examiner

Primary Examiner—Richard L. Schilling
(74) Attorney, Agent, or Firm—Finnegan, Henderson, Farabow, Garrett & Dunner, L.L.P.

(57) ABSTRACT

A TMAH developer is applied to a to-be-processed substrate that has an organic resist film formed thereon and having an LSI pattern created by exposure, thereby developing the resist pattern, followed by rinsing processes in which, while the substrate is being rotated at 500 rpm, ozone water containing 3-ppm ozone gas is applied to the substrate for fifteen seconds, thereby decomposing organic matter sticking to the exposed surface of the substrate, and then hydrogen water containing 1.2-ppm hydrogen gas is applied to the substrate for fifteen seconds, with the substrate rotated at 500 rpm, thereby removing the decomposed organic matter from the substrate.

12 Claims, 3 Drawing Sheets

| Rinsing method | Number of defects | | | Size variation (nm) (0.15 μmL/S) (3σ) |
|---|---|---|---|---|
| | Small defect <0.2 μm | Large defect >0.2 μm | Total | |
| (1) Deionized water | 254 | 233 | 487 | 9 |
| (2) Developer→ Deionized water | 18 | 9 | 27 | 15 |
| (3) Ozone water | 320 | 6 | 326 | 9.5 |
| (4) Hydrogen water | 8 | 184 | 192 | 9.5 |
| (5) Hydrogen water→ Ozone water | 141 | 82 | 223 | 9.7 |
| (6) Ozone water→ Hydrogen water | 6 | 5 | 11 | 9 |

METHOD FOR CLEANING THE SURFACE OF SUBSTRATE TO WHICH RESIDUES OF RESIST STICK

CROSS-REFERENCE TO RELATED APPLICATIONS

This application is based upon and claims the benefit of priority from the prior Japanese Patent Application No. 2000-200252, filed Jun. 30, 2000, the entire contents of which are incorporated herein by reference.

BACKGROUND OF THE INVENTION

The present invention relates to a method for cleaning the surface of a to-be-processed semiconductor substrate in a lithography process, and more particularly to a substrate process method for use in a rinsing process executed after a resist developing process using a liquid developer.

In accordance with recent developments in LSI micro pattern fabrication, there have been increasing demands for stricted specifications regarding the amount of resist residues (hereinafter referred to as "defects") on a semiconductor substrate found in a rinsing process executed after a resist pattern developing process, as well as calls for greater controllability of the size of the resist pattern formed on the semiconductor substrate. In a rinsing process executed after a resist developing process in the conventional lithography process, deionized water (DIW) is generally used as a rinsing liquid. However, the rinsing method using only deionized water is insufficient at completely eliminating all resist residues or defects, since the rinsing power of deionized water is not so strong.

To solve this problem, a rinsing method of reapplying a liquid developer to a substrate after the usual developing process has been employed recently. This method is contrived in light of the fact that the main cause of the occurrence of defects is "pH shock" in which resist-dissolved products in a liquid developer are separated as the resist residues in a rinsing liquid as a result of an abrupt reduction in pH, that appears at the changeover from the developing process to the rinsing process. In the method, defects or resist residues are dissolved in the resupplied liquid developer and eliminated together with the liquid developer, thereby reducing the number of defects which may occur when deionized water is applied in the next process.

Although this method can significantly reduce the number of defects, depending upon the combination of the resist and liquid developer the controllability of pattern dimensions may degrade, since the resupplied fresh developer is added at the point in time close to the termination of the developing process. This may increase the degree of variation in the size of resist patterns formed on the substrate.

As described above, the conventional rinsing method, which uses only deionized water in a rinsing process executed after a developing process, is limited in its power to lower the number of defects. Further, in the other conventional method of reapplying a liquid developer to a substrate after the developing process using a first supplied liquid developer is terminated, although the number of defects can be significantly reduced, the controllability of the resist pattern size is degraded, with the result that the degree of variation in the sizes of resist patterns formed on the substrate is increased.

The present invention has been developed in light of the above problems, and has its object to provide a substrate process method capable of significantly reducing the number of defects that may occur after a developing process, without increasing the degree of variation in the size of a resist pattern.

BRIEF SUMMARY OF THE INVENTION

To satisfy the object, one aspect of the present invention provides a substrate processing method for developing, using a liquid developer, a resist film formed on a to-be-processed substrate and having a desired pattern created by exposure, and then rinsing an exposed surface of the substrate, comprising: a first rinsing step of rinsing the exposed surface of the substrate using water that contains an oxidizing gas, thereby decomposing organic matter sticking to the exposed surface of the substrate; and a second rinsing step of rinsing the exposed surface of the substrate using water that contains a deoxidizing gas, thereby removing the decomposed organic matter.

Another aspect of the present invention also provides a substrate process method of developing, using a liquid developer, a resist film formed on a to-be-processed substrate and having a desired resist pattern created by exposure, and then rinsing an exposed surface of the substrate, comprising: a first rinsing step of rinsing the exposed surface of the substrate using water that contains an oxidizing gas, thereby decomposing organic matter sticking to the exposed surface of the substrate; and a second rinsing step of rinsing the exposed surface of the substrate using water that contains ammonia, thereby removing the decomposed organic matter.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Figure 1A:
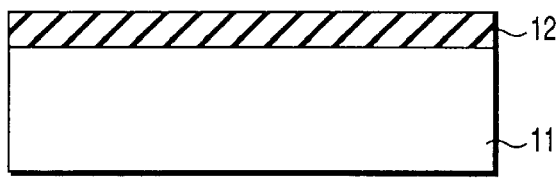
FIGS. 1A–1G are sectional views useful in explaining processes for forming a resist pattern on a substrate, according to a first embodiment of the present invention.

The embodiments of the invention will be described with reference to the accompanying drawings.

(First Embodiment)

FIGS. 1A–1G are sectional views useful in explaining resist pattern forming processes according to a first embodiment of the invention.

First, as shown in FIG, 1A, a photoresist (DUV chemically amplified organic matter) 12 with a thickness of 0.3 μm was formed on a to-be-processed substrate 11 such as a silicon semiconductor wafer using a rotational application method. Subsequently, as shown in FIG. 1B, projection/exposure of a down-sized LSI pattern was executed in an exposure unit, using a laser beam with a wavelength of 248 nm (KrF laser beam) and an exposure mask having a mask pattern including the LSI pattern (not shown). In the figure, reference numeral 13 denotes a KrF laser beam having the mask pattern, and reference numeral 14 latent image regions corresponding to the LSI pattern formed by the laser beam.

Figure 1B:
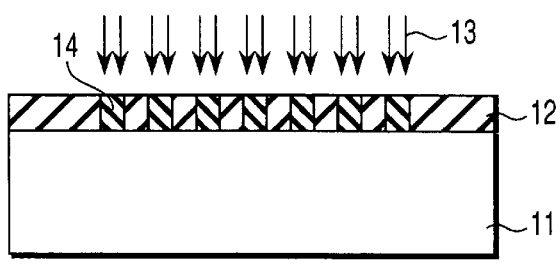
Figure 1C:
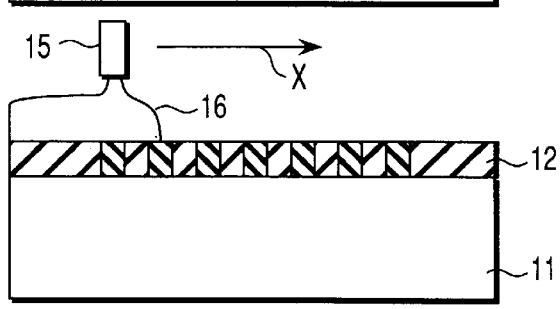
Figure 1D:
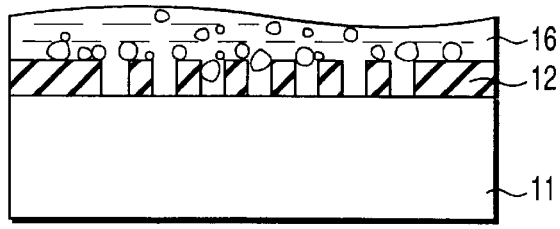

Thereafter, as shown in FIG. 1C, a liquid developer 16 containing TMAH (tetra-methyl ammonium hydroxide) at a concentration of 0.27 N was applied onto the surface of the substrate 11 through a nozzle 15, thereby forming a developer film of a certain thickness (1 mm–2 mm) on the entire surface of the substrate 11. For the application of the liquid developer 16, the nozzle 15 in the shape of, for example, a slit was moved over the substrate 11 in a direction indicated by, for example, an arrow X. After that, the substrate 11 was left as it was for a certain time period (15 sec–60 sec), thereby dissolving and eliminating the exposed portions or the latent image regions 14 of the resist 12 as shown in FIG. 1D. In this state, a plurality of resist residues 14A as dissolved organic matter are included in the liquid developer 16 in such a manner that the resist residues 14A floating in the liquid developer 16 or stick on the exposed surface portions of the substrate 11 from which the latent image regions 14 or the resist 12 are removed.

Figure 1E:
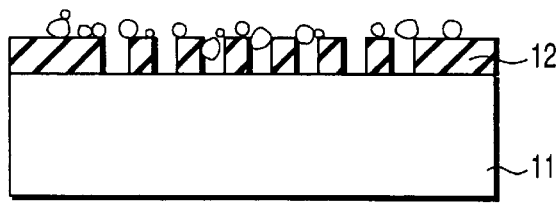

Then, the liquid developer 16 applied on the substrate 11 is removed by rotating the substrate 11 at 1000 rpm for 2 sec., for example. As a result, the resist residues 14A contained in the liquid developer 16 is removed together with the liquid developer 16 and those stuck on the surface of the resist pattern of the substrate 11 remain as shown in FIG. 1E.

Figure 1F:
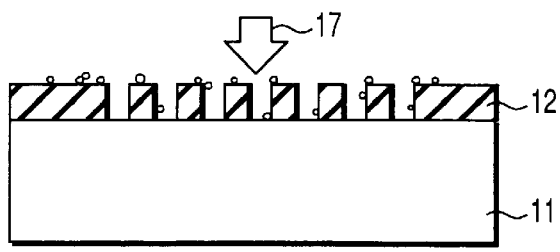

Then, as shown in FIG. 1F, the substrate 11 was subjected to a 15-sec rinsing process (a first rinsing process), in which deionized water 17 containing 3-ppm ozone gas (hereinafter referred to as "ozone water") was applied to the substrate 11 while rotating the substrate 11 at 500 rpm, thereby oxidizing and decomposing the resist residues 14A of organic material into small pieces of resist residues 14B.

Since the liquid developer 16 has been removed from the surface of the substrate 11 in advance when the ozone water is supplied to the substrate 11 in the step of FIG. 1F, it is possible to prevent the activation power of the ozone water from being degraded by the liquid developer 16.

Figure 1G:
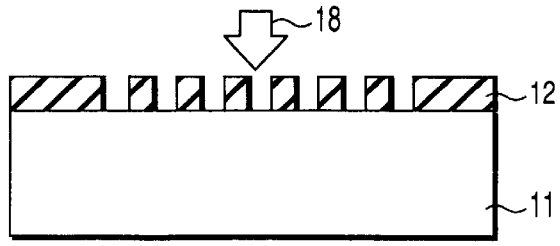

Subsequently, as shown in FIG. 1G, the substrate 11 was subjected to a 15-sec rinsing process (a second rinsing process), in which deionized water 18 containing 1.2-ppm hydrogen gas (hereinafter referred to as "hydrogen water") was applied to the substrate 11 while rotating the substrate 11 at 500 rpm. As a result, the decomposed resist residues 14B was deoxidized and removed from the surface of the substrate 11. The ozone water 17 and the hydrogen water 18 were applied to a central portion of the surface of the substrate 11, using, for example, a nozzle. The ozone water 17 and the hydrogen water 18 applied to a central portion of the substrate 11 flowed therefrom to a peripheral portion of the same because of the centrifugal force created during the rotation of the substrate 11, thereby effectively removing the remaining defects. Lastly, the substrate 11 was rotated at 3000 rpm for 20 seconds, thereby removing the hydrogen water 18 from the surface of the substrate 11 and thus drying the substrate 11.

In the above-described rinsing processes, no liquid developer was reused, unlike the prior art, and hence the number of defects could be significantly reduced compared to the conventional rinsing method in which only deionized water is used, thereby hardly changing the size of a resist pattern formed by exposure, i.e. without increasing the degree of variation in resist pattern size. Further, the rinsing process after the developing process could be executed efficiently in a short time.

Figures 2, 3:
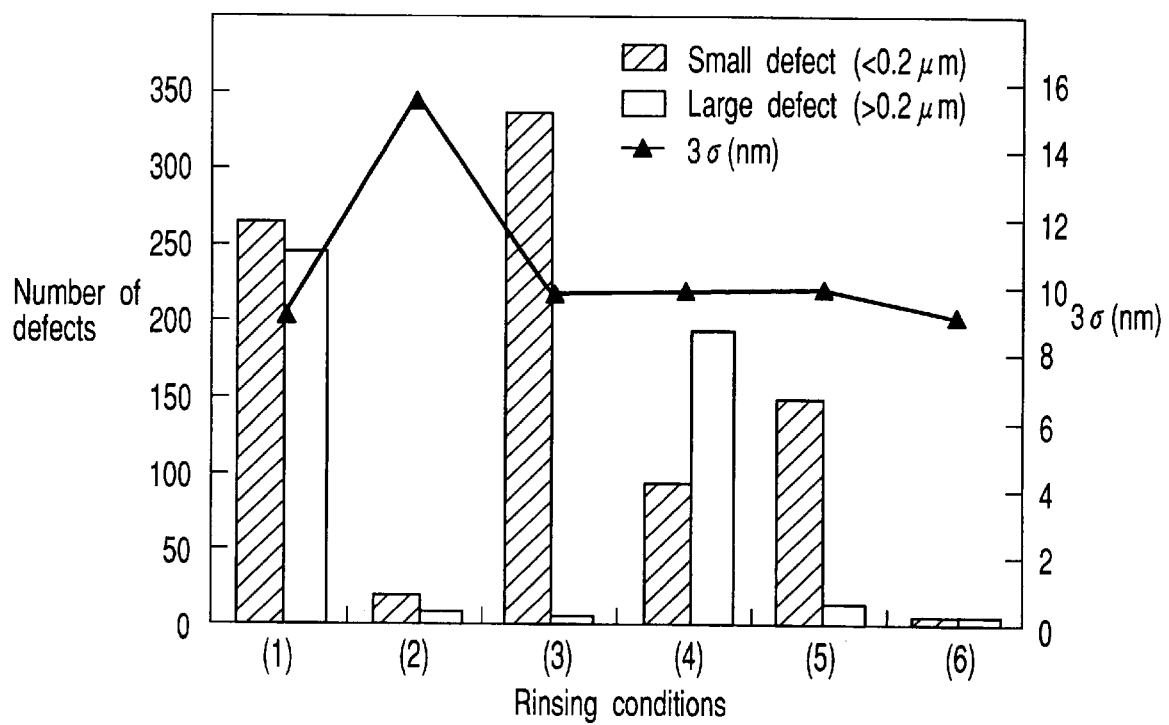
FIG. 2 is a view illustrating the relationship between the rinsing method employed after a developing process, the number of remaining defects and the pattern size variation.
FIG. 3 is a graph illustrating the relationship shown in FIG. 2.

FIGS. 2 and 3 both show relationships among various types of rinsing methods or cleaning conditions, the number of defects (obtained by KLA measurement method) on the surface of a to-be-processed substrate, and a variation of pattern sizes (nm) with respect to an L/S pattern of 0.15 μm size. The pattern size variation is denoted as values of 3σ (nm) obtained from 25 matrix points (13 points in x direction and 13 points in y direction) within the surface of the substrate 11.

In FIGS. 2 and 3, sample ① indicates results obtained by the conventional rinsing method that uses only deionized water (30 sec; 500 rpm).

Sample ② indicates results obtained by the conventional developer refreshing method that has been executed as a defect countermeasure. Specifically, in this method, a liquid developer is reapplied to a substrate for 4 seconds at 500 rpm, after once applying the developer and then removing it. As a result, the reseparation of resist-dissolved products due to the pH-shock that occurs when deionized water is applied can be avoided. After that, the alkaline component is removed by applying deionized water for 16 seconds at 500 rpm.

Sample ③ indicates results obtained by a rinsing method using 3-ppm ozone water (30 sec; 500 rpm).

Sample ④ indicates results obtained by a rinsing method using 1.2-ppm hydrogen water (30 sec; 500 rpm).

Sample ⑤ indicates results obtained by a method of executing rinsing using hydrogen water for 15 seconds at 500 rpm, and then using ozone water for 15 seconds at 500 rpm.

Sample ⑥ indicates results obtained by a method (according to this embodiment) of executing rinsing using ozone water for 15 seconds at 500 rpm, and then using hydrogen water for 15 seconds at 500 rpm.

As is evident from the results of sample ⑥ shown in FIGS. 2 and 3, the method of the present embodiment can significantly reduce the number of both small defects and large defects without increasing the degree of variation in the size of the resist pattern. In the case of the conventional developer refreshing method as indicated by sample ②, although the number of defects was reduced, the resist pattern size was greatly changed when rinsing was executed using a developer.

Figure 4:
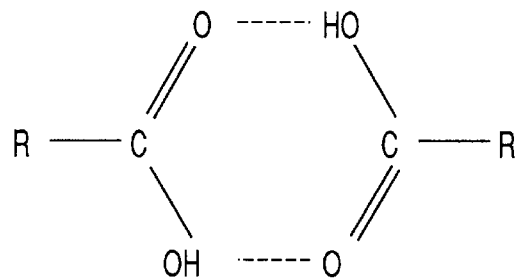
FIG. 4 is a view illustrating chemical bonding between a remaining defect after rinsing using ozone water, and the surface of the resist pattern on the substrate.

Further, in the case of sample ③ in which rinsing is executed using only ozone water, although the number of large defects is effectively reduced, the number of small defects is increased. This is caused by the dissolution of organic matter, i.e. resist-dissolved products, due to oxidation. More specifically, large resist-dissolved products are not removed but decomposed into small ones. At this time, the chemical bonding of each small defect and the substrate surface (resist pattern) is changed in a manner expressed by R—CH₃→R—COOH. Since R—COOH molecules, called dimers, are strongly bonded to each other as shown in FIG. 4, it is considered that the defects, i.e. the resist residues, could not be removed from the substrate 11.

On the other hand, in the case of rinsing using only hydrogen water such as sample ④, the number of removed defects is larger than that in the case of rinsing using only deionized water. However, the rinsing effect is insufficient. This is because hydrogen water has a deoxidizing function but no oxidizing/decomposing function unlike ozone water, and hence it is considered that a large defect sticking to a large area of the resist and the substrate surface cannot be sufficiently removed.

Samples ⑤ and ⑥ using hydrogen water and ozone water will be described.

In the method of sample ⑤ in which rinsing is first executed using hydrogen water and then rinsing using ozone water is executed, since hydrogen water does not decompose a large defect, the large defect was decomposed into small ones when rinsing using ozone water was executed. In other words, in the second rinsing step using ozone water, the number of small defects increased and remained.

Figure 5:
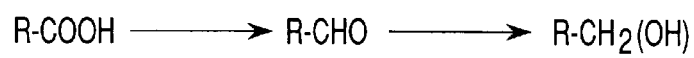
FIG. 5 is a chemical formula illustrating chemical bonding between a remaining defect after rinsing using hydrogen water following rinsing using ozone water, and the surface of a resist pattern.

In the method of sample ⑥ in which rinsing is first executed using ozone water and then hydrogen water, the number of both small defects and large defects was reduced. The reason why this method is effective is as follows: When executing rinsing using ozone, at first, large defects of the resist are oxidized and decomposed into small defects. At this time, a chemical reaction expressed by R—CH$_3$→R—COOH occurs on the resist defects and the resist pattern surface as aforementioned. The resultant small defects have strong hydrogen bonds called dimmers and hence cannot be sufficiently removed from the substrate. If they are rinsed using hydrogen water having a deoxidation function, the molecules expressed by R—COOH are deoxidized into molecules expressed by R—CH$_2$(OH) as shown in FIG. 5, with the result that the hydrogen bonding between the small defects and the resist surface is weakened. It is considered that, for this reason, the small defects could be easily removed from the substrate in the second rinsing step.

Figure 6:
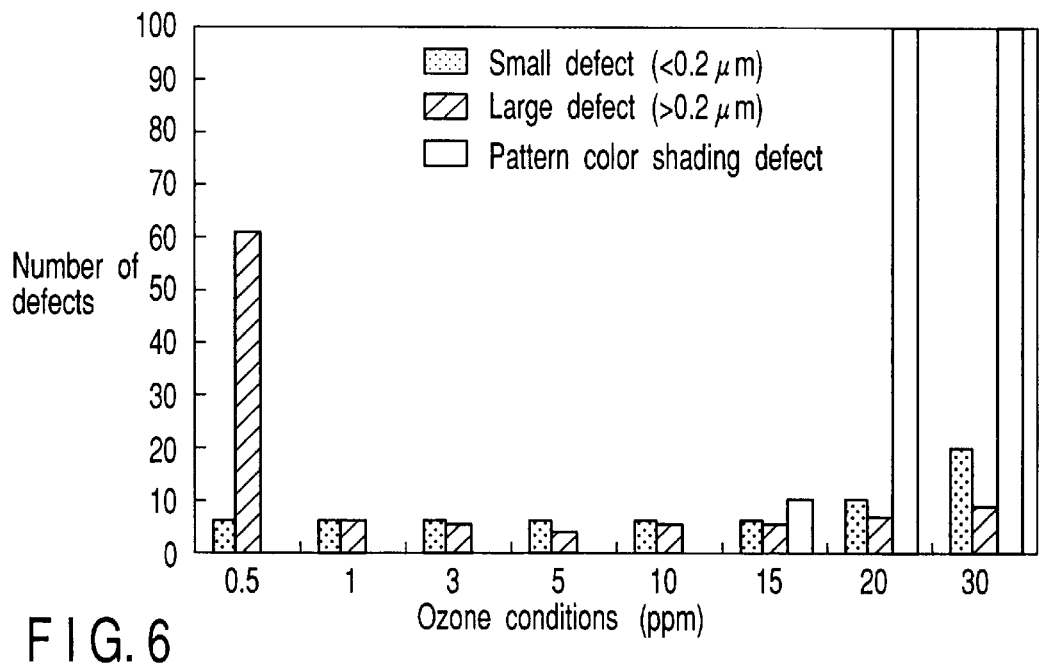
FIG. 6 is a graph illustrating the relationship between the ozone concentration of ozone water and the number of defects.

FIG. 6 illustrates variations in the number of defects, obtained when the method of sample ⑥ is used with the concentration of ozone changed from 0.5 ppm to 30 ppm. As is evident from FIG. 6, the optimal ozone concentration is approx. 1–10 ppm. If the ozone concentration is higher than that, the decomposing force of ozone is too strong, thereby over-decomposing the resist film itself, resulting in a color shading defect. On the other hand, if the ozone concentration is lower than 1 ppm, sufficient oxidation and decomposition of organic matter cannot be achieved, whereby a large defect cannot be decomposed into small ones. In light of the above, when using this method in the resist pattern forming process, it is desirable that the ozone concentration should be set at 1–10 ppm.

(Second Embodiment)

The resist pattern forming process employed in a second embodiment is basically the same as that shown in FIGS. 1A–1G, and is therefore not shown. The second embodiment differs from the first embodiment in that the latter uses ammonia water as a rinsing liquid in the second rinsing step, in place of hydrogen water.

First, as in the first embodiment, a resist (of a DUV chemically amplified type) with a thickness of 0.3 μm was formed on a to-be-processed substrate in the similar manner as in FIG. 1A, and then projection/exposure of a small-sized LSI pattern was executed, using a laser beam with a wavelength of 248 nm (KrF laser beam) and an exposure mask in the similar manner as in FIG. 1B. Subsequently, a liquid developer containing TMAH (tetramethyl ammonium hydroxide) at a concentration of 0.27 N was applied onto the surface of the substrate, thereby forming a developer film of a certain thickness (1–2 mm) on the entire wafer surface in the similar manner as in FIG. 1C. For the application of the liquid developer, the nozzle 15 in the shape of, for example, a slit was moved over the substrate 11 in a direction indicated by, for example, arrow X.

After that, the substrate was left as it was for a certain time period (15–60 sec), thereby decomposing and eliminating the exposed portions of the resist in the similar manner as in FIG. 1D, which is followed by a substrate rotation step for removing the liquid developer on the substrate together with the defects contained therein at 1000 rpm for 2 sec., for example, in the similar manner as in FIG. 1E.

Then, the substrate was subjected to a 15-sec rinsing process (a first rinsing process), in which ozone water containing 7-ppm ozone gas was applied to the substrate while rotating the substrate at 500 rpm. At this time, resist defects sticking to the surface of the resist pattern were oxidized and decomposed by the ozone water. However, a carbonyl group (R—COOH) was formed on end portions of the decomposed defects and on the resist pattern surface that was put into contact with the ozone water, to which small defects resulting from the decomposition still stuck by hydrogen bonding.

In the first embodiment, the carbonyl group was deoxidized by hydrogen water, thereby preventing the hydrogen bonding and separating and removing the defects from the resist pattern surface. In the second embodiment, the carbonyl group was decomposed using ammonia water (decarboxylation process). Specifically, the second rinsing step was executed for 15 seconds at 500 rpm, using deionized water containing 2-ppm ammonia gas (ammonia water). At this time, carboxylic acid created on end portions of the defects and on the resist surface was decomposed by decarboxylation, thereby cutting the hydrogen bonding, separating the defects from the resist pattern surface and removing them therefrom together with the rinsing ammonia water in the similar manner as in FIGS. 1F and 1G. This decomposition process can be expressed by the following chemical formula:

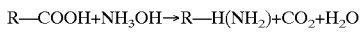

R—COOH+NH$_3$OH→R—H(NH$_2$)+CO$_2$+H$_2$O

Lastly, the ammonia water remaining on the substrate was dried by rotating the substrate for 20 seconds at 3000 rpm.

Thus, the number of defects could be reduced much more than in the conventional rinsing process using only deionized water, without increasing the degree of variation in the size of the resist pattern with respect to the position in the surface of the substrate. Moreover, the rinsing processes after the developing process could be executed efficiently in a short time.

(Modification)

The present invention is not limited to the abovedescribed embodiments. For example, although the above embodiments employ a KrF laser beam having a wavelength of 248 nm as an exposure laser beam, the present invention is not limited to this. A 193 nm-wavelength ArF laser beam, a fluorine laser beam, or a narrow-band beam obtained from a beam emitted from a hydrogen lamp can also be used in place of the KrF laser beam. Furthermore, the exposure source is not limited to a light source but may be an electron beam source, an ion beam source, an X-ray source, etc. The kind of the resist material or the resist coating method is not limited to the above-described one. The resist coating method may include a coating method using the principle of meniscus, or a film forming method for forming a liquid film on a substrate by moving a scanning nozzle over the substrate, and removing a solvent contained in the liquid film.

Although the first embodiment uses ozone as an oxidizing gas, hydrogen peroxide (H$_2$O$_2$) or oxygen may be used instead of ozone. Further, although the second embodiment uses ammonia to cause decarboxylation, amine, for example, may be used in place of ammonia. Furthermore, in the embodiments, ozone water, hydrogen water or ammonia water is applied onto the substrate in the form of a running liquid, and then the substrate is left as it is for a certain time period. Instead, they may be held and stirred on the substrate.

In the first and second rinsing processes, the rinsing time period and the rotational speed of the substrate are not limited to 15 seconds and 500 rpm, respectively, but may be changed appropriately. For example, they may be set at different values in the first and second rinsing processes. Also, the ozone concentration is not limited to 3 ppm or 7 ppm, but may be changed depending upon the resist or process used. More specifically, the ozone concentration of the ozone water may be changed in the range of 1–10 ppm.

The hydrogen concentration in the first embodiment is not limited to 1.2 ppm, but may be changed in the range of 0.5–4.5 ppm, depending upon the resist or process employed. Similarly, the ammonia concentration in the second embodiment is not limited to 2 ppm, but may be changed in the range of 0.5–10 ppm, depending upon the resist or process employed.

A method for, for example, applying a developing liquid to the entire surface of a substrate by rotating the substrate at a low speed may be employed instead of the developing method using the scanning nozzle. Further, instead of the above-described paddle developing method, a spray developing method for continuously supplying a developer during a process may be employed. The concentration of the developer and the time period for applying the developer are not limited to 0.27 N and 15–60 sec., respectively, but can be changed appropriately.

The ozone water used as the deionized water containing oxidizing gas in the described embodiment may be produced by using a conventional ozone water production unit utilizing electrolysis method. However, when this unit is used, it is found that the concentration of ozone contained in the deionized water will be reduced and transformed to oxygen at approximately 50% if the travelling distance of the ozone water from an ozone applying section to the tip of a nozzle is long.

Figure 7:
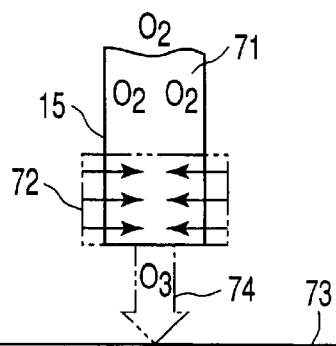
FIG. 7 is a diagram showing a method of preparing ozone water.

FIG. 7 shows an ozone water production unit which can solve the above-mentioned disadvantage in the conventional unit. As shown in FIG. 7, deionized water 71 containing oxygen $O_2$ is supplied to a light illadiation unit 72 emitting VUV light of 172 nm, for example. The unit 72 is provided on the nozzle 15 near the surface of the substrate 73 and the VUV light generated from the unit 72 is applied to the deionized water 71 to resolve the oxygen $O_2$, thereby generating ozone $O_3$ in the deionized water 71 near the surface of the substrate 73. The ozone water 74 thus produced is effectively supplied to the surface of the substrate 73 on which an exposed resist pattern (not shown) is formed.

In addition, the techniques according to the first and second embodiments are applicable to any process using an organic resin as a resist, as well as to the wafer developing process. For example, they are also applicable to a process for manufacturing exposure masks, liquid crystal substrates, compact disks (including digital video disks or DVDs) or mini disks, etc.

The embodiments can be modified in various ways without departing from the scope of the invention.

As described in detail, in the present invention, the combination of the first rinsing process using deionized water containing an oxidizing gas, and the second rinsing process using deionized water containing a deoxidizing gas or ammonia gas can sufficiently reduce the number of defects that will occur after the developing process. The combination of the rinsing processes does not degrade the controllability of the pattern size on a substrate, i.e. minimizes the degree of variation in the pattern size, which differs from the conventional method of rinsing the substrate by reapplying a developer thereto after the developing process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate process method of developing, using a liquid developer, an organic resist film formed on a to-be-processed substrate and having a desired pattern created by exposure, and then rinsing an exposed surface of the substrate, comprising:

a first rinsing step of rinsing the exposed surface of the substrate using water that contains an oxidizing gas, thereby decomposing organic matter sticking to the exposed surface of the substrate; and a second rinsing step of rinsing the exposed surface of the substrate using water that contains a deoxidizing gas, thereby removing the decomposed organic matter.

2. The method according to claim 1, wherein the to-be-processed substrate is a semiconductor substrate having a photoresist film formed on a surface thereof.

3. The method according to claim 1, wherein the first rinsing process uses oxidizing rinsing water formed by dissolving 1–10 ppm ozone gas into water.

4. The method according to claim 1, wherein before the first rinsing process, part of photo-sensitive material dissolved in the liquid developer remains on the exposed surface of the substrate.

5. The method according to claim 1, wherein the water is deionized water.

6. The method according to claim 1, wherein the second rinsing process uses deoxidizing rinsing water formed by dissolving 0.5–4.5 ppm hydrogen gas into the water.

7. The method according to claim 1, wherein, after the organic resist film is developed and before said first rinsing step using the water containing oxidizing gas is performed, developing liquid applied to the to-be-processed substrate is removed.

8. A substrate process method of developing, using a liquid developer, an organic resist film formed on a to-be-processed substrate and having a desired pattern created by exposure, and then rinsing an exposed surface of the substrate, comprising:

a first rinsing step of rinsing the exposed surface of the substrate using water that contains an oxidizing gas, thereby decomposing organic matter sticking to the exposed surface of the substrate; and a second rinsing step of rinsing the exposed surface of the substrate using water that contains ammonia, thereby removing the decomposed organic matter.

9. The method according to claim 8, wherein the to-be-processed substrate is a semiconductor substrate having a photoresist film.

10. The method according to claim 8, wherein the first rinsing process uses oxidizing rinsing water formed by dissolving 1–10 ppm ozone gas into the water.

11. The method according to claim 8, wherein before the first rinsing process, part of the photosensitive resin dissolved in the liquid developer remains on an exposed surface of the substrate.

12. The method according to claim 8, wherein the water is deionized water.

* * * * *